(12) United States Patent
Pang et al.

(10) Patent No.: US 12,341,191 B2
(45) Date of Patent: Jun. 24, 2025

(54) COMPOSITE NEGATIVE ELECTRODE MATERIAL AND PREPARATION METHOD THEREFOR AND LITHIUM BATTERY

(71) Applicants: BTR NEW MATERIAL GROUP CO., LTD., Guangdong (CN); DINGYUAN NEW ENERGY TECHNOLOGY CO., LTD., Guangdong (CN)

(72) Inventors: Chunlei Pang, Guangdong (CN); Yiming Kong, Guangdong (CN); Tengyu Liang, Guangdong (CN); Jianguo Ren, Guangdong (CN); Xueqin He, Guangdong (CN)

(73) Assignees: BTR NEW MATERIAL GROUP CO., LTD., Guangdong (CN); DINGYUAN NEW ENERGY TECHNOLOGY CO., LTD., Guangdong (CN)

( * ) Notice: Subject to any disclaimer, the term of this patent is extended or adjusted under 35 U.S.C. 154(b) by 702 days.

(21) Appl. No.: 17/616,080

(22) PCT Filed: Sep. 25, 2020

(86) PCT No.: PCT/CN2020/117889
§ 371 (c)(1),
(2) Date: Dec. 2, 2021

(87) PCT Pub. No.: WO2021/057923
PCT Pub. Date: Apr. 1, 2021

(65) Prior Publication Data
US 2022/0320505 A1 Oct. 6, 2022

(30) Foreign Application Priority Data
Sep. 26, 2019 (CN) .......................... 201910918320.8

(51) Int. Cl.
*H01M 4/48* (2010.01)
*H01M 4/02* (2006.01)
(Continued)

(52) U.S. Cl.
CPC ........... *H01M 4/48* (2013.01); *H01M 4/0428* (2013.01); *H01M 4/625* (2013.01);
(Continued)

(58) Field of Classification Search
CPC ...... H01M 4/48; H01M 4/0428; H01M 4/625; H01M 10/0525; H01M 2004/021;
(Continued)

(56) References Cited

U.S. PATENT DOCUMENTS

| 2017/0104211 | A1 | 4/2017 | Tanaka et al. |
| 2017/0110722 | A1 | 4/2017 | Lee et al. |
| 2018/0083272 | A1* | 3/2018 | Son ...................... H10N 10/855 |

FOREIGN PATENT DOCUMENTS

| CN | 105449173 A | 3/2016 |
| CN | 105680006 A | 6/2016 |

(Continued)

OTHER PUBLICATIONS

PCT International Search Report for PCT Application No. PCT/CN2020/117889 mailed Jan. 4, 2021 (7 pages, with English translation).

(Continued)

*Primary Examiner* — Adam A Arciero
(74) *Attorney, Agent, or Firm* — Merchant & Gould P.C.

(57) ABSTRACT

Provided are a composite negative electrode material, a preparation method therefor and a lithium battery. The composite negative electrode material comprises silicon-containing particles and a carbon coating layer coating at least part of the surface of silicon-containing particles. In Raman spectrum, the composite negative electrode material (Continued)

has a silicon characteristic peak A between 450 cm$^{-1}$-550 cm$^{-1}$, a carbon characteristic peak B between 1300 cm$^{-1}$-1400 cm$^{-1}$, a carbon characteristic peak C between 1530 cm$^{-1}$-1630 cm$^{-1}$, and a graphene structure characteristic peak D between 2500 cm$^{-1}$-2750 cm$^{-1}$. The preparation method comprises: in protective atmosphere, introducing reaction gas to react with silicon-containing particles, the reaction temperature being 700° C.-1450° C., and the reaction gas comprising a carbon-containing gas, so that at least part of the surface of silicon-containing particles form a carbon coating layer, so as to obtain the composite negative electrode material.

2 Claims, 4 Drawing Sheets

(51) Int. Cl.
*H01M 4/04* (2006.01)
*H01M 4/62* (2006.01)
*H01M 10/0525* (2010.01)

(52) U.S. Cl.
CPC .. *H01M 10/0525* (2013.01); *H01M 2004/021* (2013.01); *H01M 2004/027* (2013.01)

(58) Field of Classification Search
CPC ........... H01M 2004/027; H01M 4/386; H01M 4/366; H01M 4/483; H01M 4/628; H01M 4/5825; Y02E 60/10; C23C 16/4417; C23C 16/26
See application file for complete search history.

(56) References Cited

FOREIGN PATENT DOCUMENTS

| | | | |
|---|---|---|---|
| CN | 107251279 | A | 10/2017 |
| CN | 107317006 | A | 11/2017 |
| CN | 107579239 | A | 1/2018 |
| CN | 107710465 | A | 2/2018 |
| CN | 107845785 | A | 3/2018 |
| CN | 108390051 | A | 8/2018 |
| CN | 109994717 | A | 7/2019 |
| CN | 110034284 | A | 7/2019 |
| CN | 111029543 | A | 4/2020 |
| CN | 111106329 | A | 5/2020 |
| CN | 111162268 | A | 5/2020 |

OTHER PUBLICATIONS

PCT Written Opinion for PCT Application No. PCT/CN2020/117889 mailed Jan. 4, 2021 (6 pages).
Chinese Office Action for CN Application No. 201910918320.8 mailed Oct. 10, 2020 (8 pages).
Chinese Office Action for CN Application No. 201910918320.8 mailed Jan. 13, 2021 (8 pages, with English translation).
Chinese Notification of Grant for CN Application No. 201910918320.8 (3 pages, with English translation).

* cited by examiner

COMPOSITE NEGATIVE ELECTRODE MATERIAL AND PREPARATION METHOD THEREFOR AND LITHIUM BATTERY

CROSS-REFERENCE TO RELATED APPLICATIONS

This application is a National Stage Application of PCT/CN2020/117889, filed 25 Sep. 2020, which claims priority benefit to application No. 201910918320.8 filed with the Chinese Patent Office on 26 Sep. 2019, and entitled "Composite Negative Electrode Material and Preparation Method Therefor and Lithium Battery", all the contents of which are incorporated herein by reference in their entirety.

TECHNICAL FIELD

The present disclosure pertains to the technical field of battery materials, and relates to a negative electrode material, a method of preparing the same, and a lithium battery, and in particular to a composite negative electrode material, a method of preparing the same, and a lithium battery.

BACKGROUND ART

A lithium battery is a secondary battery (rechargeable battery), which is operated mainly by means of the movement of lithium ions between a positive electrode and a negative electrode. During charging and discharging processes, $Li^+$ ions are reversibly intercalated and deintercalated between the two electrodes. During charging, the $Li^+$ ions are deintercalated from the positive electrode and intercalated into the negative electrode through the electrolyte, and the negative electrode is in a lithium-rich state. The process is reversed during discharging.

A negative electrode of a lithium battery is formed by uniformly applying, onto both sides of a copper foil, a paste glue made of a mixture of a carbon material or a non-carbon material acting as an active material of negative electrode, a binder and additives and then drying and rolling the copper foil. The key to the successful fabrication of lithium batteries lies in the preparation of negative electrode materials allowing reversible deintercalation/intercalation of lithium ions. Generally, a good negative electrode material should be selected based on the following principles: providing high specific energy; having a low electrode potential relative to a lithium electrode; enabling highly reversible charge and discharge reactions; having good compatibility with an electrolyte and a binder; having a small specific surface area ($<10$ $m^2/g$) and high true density ($>2.0$ $g/cm^3$); having good dimensional and mechanical stability during intercalation of lithium; being obtainable from abundant resources with low price; and being stable in air and having no toxic side effects. Currently, the negative electrode materials that have been actually used in lithium batteries are generally carbon materials, such as graphite, soft carbon (e.g., coke or the like), hard carbon, and so on. The negative electrode materials being explored include nitrides, PAS, tin-based oxides, tin alloys, nanoscale negative electrode materials, and some other intermetallic compounds.

In recent years, there is an increasingly urgent demand for high-performance lithium batteries. The market for products represented by consumer electronics and electric vehicles is continuously expanding, and accordingly there is a more urgent demand for negative electrode materials for high-performance lithium batteries.

A method for modifying a composite negative electrode material for a lithium battery by film coating is disclosed. In this solution, the composite negative electrode material includes a negative electrode material and a metal film or a metal oxide film covering the surface thereof, and the covering metal film or metal oxide film is made by using a magnetron sputtering coating method.

Another modified silicon-based negative electrode material and its preparation method and use are disclosed. In this solution, the modified silicon-based negative electrode material includes a silicon-based negative electrode substrate, into which lithium ions are intercalated. The preparation method includes a step of preparing a lithium-containing aromatic compound solution and a step of performing a process of intercalating lithium into the silicon-based negative electrode substrate.

Yet another silicon monoxide-containing composite negative electrode material for a lithium battery, and its preparation method and use are disclosed. The silicon monoxide-containing composite material consists of silicon monoxide powder and a conductive carbon layer uniformly and densely applied to the surface of the silicon monoxide powder.

However, all the above-mentioned solutions have the problem that the cycling performance and rate capability of the negative electrode material need to be improved.

SUMMARY

In view of this, an object of the present disclosure is to provide a composite negative electrode material, a method of preparing the same, and a lithium battery. The composite negative electrode material according to the present disclosure has advantages such as a high cycle capacity retention ratio, good rate capability, and low aging loss at high temperature.

To achieve this object, the following technical solutions are used in the present disclosure.

In a first aspect, the present disclosure provides a composite negative electrode material. The composite negative electrode material comprises silicon-containing particles and a carbon covering layer, wherein the carbon covering layer covers at least part of surface of the silicon-containing particles.

In a Raman spectrum, the composite negative electrode material has a characteristic peak A of silicon between 450 $cm^{-1}$ and 550 $cm^{-1}$, a characteristic peak B of carbon between 1300 $cm^{-1}$ and 1400 $cm^{-1}$, a characteristic peak C of carbon between 1530 $cm^{-1}$ and 1630 $cm^{-1}$, and a characteristic peak D of graphene structure between 2500 $cm^{-1}$ and 2750 $cm^{-1}$.

The Raman spectral peaks of the composite negative electrode material according to the present disclosure include a characteristic peak D of graphene structure, which indicates that the carbon covering layer thereof contains a small amount of a graphene structure. The carbon covering layer containing the graphene structure can improve the conductivity of the product and improve the rate capability. The uniformly grown graphene structure described above can further improve the stability of the solid-liquid interface between the particle surface of the product and the electrolyte to form a uniform SEI film, thereby improving the storage performance of the product at high temperature and reducing the aging loss at high temperature.

In a feasible embodiment, in the Raman spectrum, a ratio $I_A/I_D$ of a peak intensity $I_A$ of the characteristic peak A of silicon to a peak intensity $I_D$ of the characteristic peak D of graphene structure is greater than 0.1 and less than 30, and a ratio $I_D/I_B$ of the peak intensity $I_D$ of the characteristic peak D of graphene structure to a peak intensity $I_B$ of the characteristic peak B of carbon is greater than 0 and less than 1.

In a feasible embodiment, the composite negative electrode material satisfies at least one of the following definitions a to f:
a. the silicon-containing particles comprise at least one of Si, $SiO_x$, and silicate, where $0<x<2$;
b. the silicon-containing particles have an average particle size of 0.1 μm to 20 μm;
c. the silicon-containing particles have a specific surface area greater than 150 $cm^2/g$;
d. the carbon covering layer is an inorganic carbon material layer;
e. the carbon covering layer has a thickness of 10 nm to 300 nm; and
f. the composite negative electrode material comprises, by mass fraction, 1% to 65% of the carbon covering layer.

In a second aspect, the present disclosure provides a method for preparing a composite negative electrode material. The method comprises the steps of:
introducing a reactant gas to react with silicon-containing particles in the presence of a protective atmosphere so that a carbon covering layer is formed on at least part of surface of the silicon-containing particles to obtain the composite negative electrode material, where the reaction is carried out at a temperature of 700° C. to 1450° C., and the reactant gas comprises a carbon-containing gas.

In the method for preparing a composite negative electrode material according to the present disclosure, a silicon-containing particulate material is heated to a preset temperature, and then a carbon-containing gas is introduced such that the carbon-containing gas reacts on the surface of the silicon-containing particles, whereby a carbon covering layer containing a graphene structure is grown in situ on at least part of the surface of the silicon-containing particles. The carbon covering layer containing the graphene structure can improve the conductivity of the product and improve the rate capability. The difficulty in preparation is greatly reduced because graphene is not used directly for covering. The entire preparation process involves a simple operation, a short procedure, well-developed techniques, low production difficulty, and controllable cost, and thus can be advantageously used in the industrialized mass production.

In a feasible embodiment, the method satisfies at least one of the following definitions a to f:
a. the silicon-containing particles comprise at least one of Si, $SiO_x$, and silicate, where $0<x<2$;
b. the silicon-containing particles have an average particle size of 0.1 μm to 20 μm;
c. the silicon-containing particles have a specific surface area greater than 150 $cm^2/g$;
d. the carbon covering layer is an inorganic carbon material layer;
e. the carbon covering layer has a thickness of 10 nm to 300 nm;
f. the composite negative electrode material comprises, by mass fraction, 1% to 65% of the carbon covering layer.

In a feasible embodiment, in a Raman spectrum, the composite negative electrode material has a characteristic peak A of silicon between 450 $cm^{-1}$ and 550 $cm^{-1}$, a characteristic peak B of carbon between 1300 $cm^{-1}$ and 1400 $cm^{-1}$, a characteristic peak C of carbon between 1530 $cm^{-1}$ and 1630 $cm^{-1}$, and a characteristic peak D of graphene structure between 2500 $cm^{-1}$ and 2750 $cm^{-1}$, a ratio $I_A/I_D$ of a peak intensity $I_A$ of the characteristic peak A of silicon to a peak intensity $I_D$ of the characteristic peak D of graphene structure is greater than 0.1 and less than 30, and a ratio $I_D/I_B$ of the peak intensity $I_D$ of the characteristic peak D of graphene structure to a peak intensity $I_B$ of the characteristic peak B of carbon is greater than 0 and less than 1.

In a feasible embodiment, the method satisfies at least one of the following definitions a to b:
a. the protective atmosphere comprises at least one of nitrogen, helium, neon, argon, krypton, and xenon;
b. the carbon-containing gas comprises at least one of methane, acetylene, ethylene, propyne, propylene, toluene vapor, benzene vapor, acetone vapor, and formaldehyde vapor.

In a feasible embodiment, the reactant gas further comprises an auxiliary gas, and the auxiliary gas comprises hydrogen.

In a feasible embodiment, a molar ratio of the carbon-containing gas to the auxiliary gas is (2-10):1 (2:1 to 10:1).

In a feasible embodiment, the method satisfies at least one of the following definitions a to d:
a. the reaction is carried out by means of chemical vapor deposition;
b. the reaction is carried out by means of chemical vapor deposition, and the chemical vapor deposition is carried out at a reaction temperature of 700° C. to 1150° C.,
c. the reaction is carried out by means of chemical vapor deposition, and the chemical vapor deposition is carried out at a temperature maintained for a duration of 3 h to 16 h;
d. the reaction is carried out by means of chemical vapor deposition, and the chemical vapor deposition is carried out at a reaction pressure of 1.0 atm to 10.0 atm.

In a feasible embodiment, the method comprises the steps of:
heating silicon-containing particles to 700° C. to 1450° C. in the presence of a protective atmosphere;
introducing a reactant gas to perform chemical vapor deposition so that a carbon covering layer is formed on at least part of surface of the silicon-containing particles to obtain a composite negative electrode material, where the reactant gas comprises a carbon-containing gas.

In a feasible embodiment, the method comprises the steps of:
heating silicon-containing particles to 700° C. to 1150° C. in the presence of a protective atmosphere;
introducing a carbon-containing gas and hydrogen in a molar ratio of (2-10):1 (2:1 to 10:1) into the silicon-containing particles to carry out a chemical vapor deposition reaction, wherein the reaction is controlled to take place at a gas pressure of 1.0 atm to 10.0 atm and at the temperature maintained for 3 h to 16 h, so that a carbon covering layer is formed on at least part of surface of the silicon-containing particles to obtain the composite negative electrode material.

In a third aspect, the present disclosure provides a lithium battery, comprising the composite negative electrode material according to the above first aspect or the composite negative electrode material prepared by the preparation method according to the above second aspect.

Compared with the prior art, the present disclosure has the following advantageous effects.

(1) The composite negative electrode material according to the present disclosure has unique Raman spectral peaks including a characteristic peak D of graphene structure, which indicates that its carbon covering layer contains a small amount of a graphene structure. The carbon covering layer containing the graphene structure can improve the conductivity of the product and improve the rate capability. The uniformly grown graphene structure described above can further improve the stability of the solid-liquid interface between the particle surface of the product and the electrolyte to form a uniform SEI film, thereby improving the storage performance of the product at high temperature. The composite negative electrode material has advantages such as a high cycle capacity retention ratio, good rate capability, and low aging loss at high temperature.

(2) In the preparation method according to the present disclosure, a silicon-containing particulate material is heated to a preset temperature, and then a carbon-containing gas is introduced such that the carbon-containing gas is deposited on the surface of the silicon-containing particles by chemical vapor deposition, whereby a carbon covering layer is grown in situ, and the carbon covering layer contains a small amount of a graphene. The difficulty in preparation is greatly reduced because graphene is not used directly for covering. The entire preparation process involves a simple operation, a short procedure, well-developed techniques, low production difficulty, and controllable cost, and thus can be advantageously used in the industrialized mass production.

DETAILED DESCRIPTION OF THE EMBODIMENTS

Figure 1:
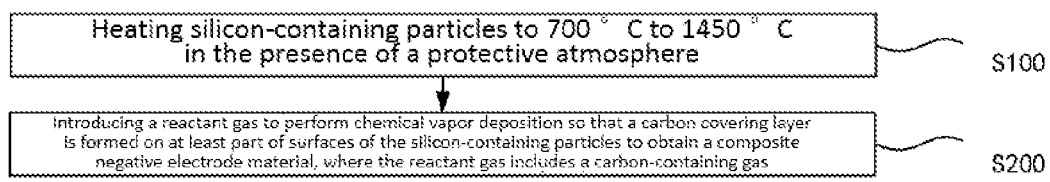
FIG. 1 is a process flowchart of a method for preparing a composite negative electrode material according to the present disclosure.

The present disclosure will be described in further detail below, in order to provide a better illustration of the present disclosure and facilitate the understanding of the technical solutions of the present disclosure. However, the following embodiments are merely simple examples of the present disclosure and are not intended to represent or limit the scope of protection of the present disclosure. The scope of protection of the present disclosure is defined by the claims.

Typical but non-limiting embodiments of the present disclosure are given below.

In a first aspect, an embodiment of the present disclosure provides a composite negative electrode material. The composite negative electrode material includes silicon-containing particles and a carbon covering (or coating) layer. The carbon covering layer covers at least part of surface of the silicon-containing particles. In a Raman spectrum, the composite negative electrode material has a characteristic peak A of silicon between 450 and 550 $cm^{-1}$, a characteristic peak B of carbon between 1300 and 1400 $cm^{-1}$, a characteristic peak C of carbon between 1530 and 1630 $cm^{-1}$, and a characteristic peak D of graphene structure between 2500 and 2750 $cm^{-1}$.

In the Raman spectrum of the composite negative electrode material according to the present disclosure, the characteristic peak A is a characteristic peak of silicon, the characteristic peak B and the characteristic peak C are characteristic peaks of carbon, and the characteristic peak D is a characteristic peak of graphene structure. The carbon covering layer containing a graphene structure described above is grown in situ on at least part of the surface of the silicon-containing particles. The carbon covering layer containing the graphene structure can improve the conductivity of the product and improve the rate capability. The uniformly grown graphene structure described above can further improve the stability of the solid-liquid interface between the particle surface of the product and the electrolyte to form a uniform SEI film, thereby improving the storage performance of the product at high temperature and reducing the aging loss at high temperature.

Such composite negative electrode material with special Raman spectral characteristics according to the present disclosure has advantages such as a high cycle capacity retention ratio, good rate capability, and low aging loss at high temperature.

The following description is illustrative of optional technical solutions of the present disclosure, but is not intended to limit the technical solutions according to the present disclosure. The technical objectives and advantageous effects of the present disclosure can be better achieved and realized by the following preferred technical solutions.

As an optional technical solution of the present disclosure, in the Raman spectrum, a ratio $I_A/I_D$ of the peak intensity $I_A$ of the characteristic peak A of silicon to the peak intensity $I_D$ of the characteristic peak D of graphene structure is greater than 0.1 and less than 30, for example, $I_A/I_D$ is 0.2, 0.5, 1, 5, 10, 15, 20, 25, or 29, and a ratio $I_D/I_B$ of the peak intensity $I_D$ of the characteristic peak D of graphene structure to the peak intensity $I_B$ of the characteristic peak B of carbon is greater than 0 and less than 1, for example, $I_D/I_B$ is 0.1, 0.2, 0.32, 0.4, 0.5, 0.6, 0.7, 0.8, or 0.9.

In the present disclosure, the characteristic peak A is a characteristic peak of silicon, and the characteristic peak D is a characteristic peak of graphene structure. Therefore, $I_A/I_D$ can indicate the uniformity of growth of the graphene structure. If the value is smaller, the graphene structure is grown more uniformly, but if the value is less than 0.1, it is meant that the carbon covering layer has an excessive thickness, which will adversely affect the transmission of lithium ions and result in performance deterioration. Therefore, in the present disclosure, $I_A/I_D$ is controlled to be greater than 0.1 and less than 30, so that the graphene structure of the product is grown uniformly and the carbon covering layer has an appropriate thickness, thereby obtaining good product performance. The characteristic peak B and the characteristic peak C are characteristic peaks of the carbon material, the characteristic peak D is a characteristic peak of graphene structure, and the characteristic peak B may indicate a defect structure at an amorphous or lamellar edge in the carbon material. Therefore, $I_D/I_B$ can be used to represent the ratio between the graphene structure and the defect structure of the product. $I_D/I_B$ being less than 1 indicates that the composite negative electrode material of the present disclosure is obtained by in-situ growth, and the carbon covering layer contains a large number of fine and dense graphene structures. The silicon-containing particles are not covered by directly using a graphene sheet, thus the difficulty in preparation is greatly reduced, and the advantages of high productivity and controllable cost are obtained.

As an optional technical solution of the present disclosure, the carbon covering layer is an inorganic carbon material layer.

It should be noted that the carbon covering layer covers the surfaces of the silicon-containing particles. The surfaces mentioned in the present disclosure not only include the flat surfaces of the particles, but the carbon covering layer may also be filled in cracks, pores, and other structures in the surfaces of the particles, which are not limited here.

In some of the embodiments, the mass fraction of the carbon covering layer in the composite negative electrode material is 1% to 65%, for example, 1%, 10%, 20%, 30%, 40%, 50%, 60%, or 65%, but the mass fraction is not limited to the listed values, and other unlisted values within this numerical range are also applicable. In the present disclosure, if the mass fraction of the carbon covering layer is less than 1%, the covering amount is insufficient, and the performance of the product cannot be fully utilized. If the mass fraction of the carbon covering layer is greater than 65%, the carbon covering amount is excessive, which will adversely affect the capacity and hinder the transmission of lithium ions, to degrade the overall performance of the negative electrode material.

In some of the embodiments, in the composite negative electrode material, the carbon covering layer has a thickness of 10 nm to 300 nm, for example, 10 nm, 20 nm, 50 nm, 80 nm, 100 nm, 150 nm, 200 nm, 250 nm, or 300 nm, but the thickness is not limited to the listed values, and other unlisted values within this numerical range are also applicable. If the carbon covering layer is too thick, the lithium ion transmission efficiency is reduced, the material is not advantageous in charging and discharging at a high rate, and the overall performance of the negative electrode material will be degraded. An excessively thin carbon covering layer does not contribute to an increase in the conductivity of the negative electrode material and has a weak capability of inhibiting the expansion of the volume of the material, resulting in poor long-cycling performance.

As an optional technical solution of the present disclosure, the silicon-containing particles include at least one of Si, $SiO_x$, and silicate, where $0<x<2$. The silicon-containing particles in the present disclosure are not limited to a specific spatial structure, particle size, morphology, doping, silicon-carbon composite, etc. The composite negative electrode material proposed in the present disclosure can be obtained from different silicon-containing particles by fine adjustment of specific parameters for preparation.

In some of the embodiments, the silicon-containing particles have an average particle size of 0.1 μm to 20 μm, for example, 0.1 μm, 0.5 μm, 1 μm, 3 μm, 5 μm, 10 μm, 13 μm, 15 μm, 18 μm, or 20 μm. The cycling performance of the negative electrode material is advantageously improved by controlling the average particle size of the silicon-containing particles within the above range.

In some of the embodiments, the silicon-containing particles have a specific surface area of greater than 150 $cm^2/g$, for example, 150 $cm^2/g$, 180 $cm^2/g$, 200 $cm^2/g$, 250 $cm^2/g$, 300 $cm^2/g$, 400 $cm^2/g$, or 500 $cm^2/g$. When the specific surface area of the silicon-containing particles is within the above range, the initial efficiency of a lithium battery made of the negative electrode material can be advantageously improved, and the cycling performance of the negative electrode material is advantageously improved.

In some of the embodiments, "x" in the $SiO_x$ satisfies $0<x<2$. For example, x is 0.1, 0.2, 0.5, 0.8, 1, 1.2, 1.5, 1.7, or 1.9.

In a second aspect, the present disclosure provides a method for preparing a composite negative electrode material. The method includes the steps of:

introducing a reactant gas to react with silicon-containing particles in the presence of a protective atmosphere so that a carbon covering layer is formed on at least part of surface of the silicon-containing particles to obtain the composite negative electrode material, where the reaction is carried out at a temperature of 700° C. to 1450° C., and the reactant gas includes a carbon-containing gas.

In the method according to the present disclosure, a carbon-containing gas is reacted with silicon-containing particles at 700° C. to 1450° C., so that carbon is grown in situ on at least part of the surface of the silicon-containing particles to form a carbon covering layer. The carbon covering layer has a graphene structure, which can improve the conductivity of the product and improve the rate capability. The uniformly grown graphene structure can further improve the stability of the solid-liquid interface between the particle surface of the product and the electrolyte to form a uniform SEI film, thereby improving the storage performance of the product at high temperature and reducing the aging loss at high temperature.

As an optional technical solution of the present disclosure, the silicon-containing particles include at least one of Si, $SiO_x$, and silicate, where $0<x<2$. The silicon-containing particles in the present disclosure are not limited to a specific spatial structure, particle size, morphology, doping, silicon-carbon composite, etc. The composite negative electrode material proposed in the present disclosure can be obtained from different silicon-containing particles by fine adjustment of specific parameters for preparation.

In some of the embodiments, the silicon-containing particles have an average particle size of 0.1 μm to 20 μm, for example, 0.1 μm, 0.5 μm, 1 μm, 3 μm, 5 μm, 10 μm, 13 μm, 15 μm, 18 μm, or 20 μm. The cycling performance of the negative electrode material is advantageously improved by controlling the average particle size of the silicon-containing particles within the above range.

In some of the embodiments, the silicon-containing particles have a specific surface area of greater than 150 $cm^2/g$, for example, 150 $cm^2/g$, 180 $cm^2/g$, 200 $cm^2/g$, 250 $cm^2/g$, 300 $cm^2/g$, 400 $cm^2/g$, or 500 $cm^2/g$. When the specific surface area of the silicon-containing particles is within the above range, the initial efficiency of a lithium battery made of the negative electrode material can be advantageously improved, and the cycling performance of the negative electrode material is advantageously improved.

In some of the embodiments, "x" in the $SiO_x$ satisfies $0<x<2$. For example, x is 0.1, 0.2, 0.5, 0.8, 1, 1.2, 1.5, 1.7, or 1.9.

In the preparation method according to the present disclosure, the reactant gas and the silicon-containing particulate material undergo a chemical vapor deposition reaction. The composite negative electrode material described in the present disclosure can be prepared using the preparation method according to the present disclosure by simple chemical vapor deposition.

The composite negative electrode material is prepared such that, in a Raman spectrum, the composite negative electrode material has a characteristic peak A of silicon between 450 and 550 $cm^{-1}$, a characteristic peak B of carbon between 1300 and 1400 $cm^{-1}$, a characteristic peak C of carbon between 1530 and 1630 $cm^{-1}$, and a characteristic peak D of graphene structure between 2500 and 2750 cm$^{-1}$. Preferably, a ratio $I_A/I_D$ of the peak intensity $I_A$ of the characteristic peak A of silicon to the peak intensity $I_D$ of the characteristic peak D of graphene structure is greater than 0.1 and less than 30, and a ratio $I_D/I_B$ of the peak intensity $I_D$ of the characteristic peak D of graphene structure to the peak intensity $I_B$ of the characteristic peak B of carbon is greater than 0 and less than 1.

As an optional technical solution of the present disclosure, the protective atmosphere includes at least one of nitrogen, helium, neon, argon, krypton, and xenon.

In some of the embodiments, the carbon-containing gas includes at least one of methane, acetylene, ethylene, propyne, propylene, toluene vapor, benzene vapor, acetone vapor, and formaldehyde vapor.

In some of the embodiments, the reactant gas further includes an auxiliary gas.

In some of the embodiments, the auxiliary gas includes hydrogen. Hydrogen can control the reaction rates of certain carbon-containing gases (e.g., acetylene), so that they can more easily produce graphene structures at large flow rates to improve the production efficiency.

In some of the embodiments, the molar ratio of the carbon-containing gas to the auxiliary gas is (2-10):1 (2:1 to 10:1), for example, 2:1, 3:1, 4:1, 5:1, 6:1, 7:1, 8:1, 9:1 or 10:1, but the molar ratio is not limited to the listed values, and other unlisted values within this numerical range are also applicable.

As an optional technical solution of the present disclosure, the reactant gas is introduced at a rate of 0.1 to 6.0 L/min, for example, 0.1 L/min, 0.3 L/min, 0.5 L/min, 1.0 L/min, 2.0 L/min, 3.0 L/min, 4.0 L/min, 5.0 L/min, or 6.0 L/min, but the introduction rate is not limited to the listed values, and other unlisted values within this numerical range are also applicable. In the present disclosure, if the reactant gas is introduced at a too fast rate, no graphene structure can be generated. If the reactant gas is introduced at a too slow rate, the deposition efficiency will be too low, which will adversely affect the productivity and practical value. However, this preferred condition is obtained by experiments using a small experimental furnace with a volume of 5 L and may not be applicable to other reactors with volumes considerably different therefrom. Therefore, in the present disclosure, the rate of introduction of the reactant gas is not limited within the above-mentioned preferred range and can be adjusted adaptively according to the preparation conditions.

As an optional technical solution of the present disclosure, the reaction is carried out by means of chemical vapor deposition, and the chemical vapor deposition is carried out at a reaction temperature of 700° C. to 1450° C., for example, 700° C., 800° C., 900° C., 1000° C., 1050° C., 1100° C., 1150° C., 1200° C., 1250° C., 1300° C., 1350° C., 1400° C., or 1450° C., but the reaction temperature is not limited to the listed values, and other unlisted values within this numerical range are also applicable. If the reaction temperature is lower than 700° C., the in-situ growth of the carbon covering layer containing the graphene structure will be adversely affected. As a result, no characteristic peak D of graphene structure will be observed in the Raman test of the product.

In some of the embodiments, the chemical vapor deposition is carried out at a reaction temperature of 700° C. to 1150° C., for example, 700° C., 800° C., 900° C., 1000° C., 1050° C., or 1150° C., but the reaction temperature is not limited to the listed values, and other unlisted values within this numerical range are also applicable. In the present disclosure, if the reaction temperature is too high, the carbon covering layer will be reacted with the silicon-containing core to generate electrochemically inert silicon carbide, resulting in deterioration of the electrochemical performance of the product. If the reaction temperature is too low, no graphene structure will be generated.

In some of the embodiments, the chemical vapor deposition is carried out at a temperature maintained for a duration of 3 h to 16 h, for example, 3 h, 4 h, 5 h, 6 h, 7 h, 8 h, 9 h, 10 h, 11 h, 12 h, 13 h, 14 h, 15 h, or 16 h, but the temperature maintaining duration is not limited to the listed values, and other unlisted values within this numerical range are also applicable.

In some of the embodiments, the chemical vapor deposition is carried out at a reaction pressure of 1.0 atm to 10.0 atm, for example, 1.0 atm, 2.0 atm, 4.0 atm, 6.0 atm, 7.0 atm, 8.0 atm, 9.0 atm, or 10.0 atm, but the reaction pressure is not limited to the listed values, and other unlisted values within this numerical range are also applicable. In the present disclosure, if the reaction pressure is too high, the reaction will take place at a too slow rate to adversely affect the productivity and practicability, and there is a safety risk. If the reaction pressure is too low, an inert atmosphere of the reaction environment cannot be ensured. If the pressure is lower than 1 atm, air may even be sucked back into the reaction chamber with a high-temperature combustible gas, causing a serious safety risk.

In the present disclosure, the reactant gas flow rate, the reaction temperature, the reaction pressure, and the temperature maintaining duration described above can be used such that these operating conditions coordinate with each other, thereby better improving the performance of the product and ensuring the appearance of the characteristic peak D representing the graphene structure.

In some of the embodiments, as shown in FIG. 1, the method includes the following steps S100 to S200:

In S100, silicon-containing particles are heated to 700° C. to 1450° C. in the presence of a protective atmosphere.

In S200, a reactant gas is introduced to perform chemical vapor deposition so that a carbon covering layer is formed on at least part of surface of the silicon-containing particles to obtain a composite negative electrode material, where the reactant gas includes a carbon-containing gas.

As a preferred technical solution of the present disclosure, the reaction is carried out in a chemical vapor deposition (CVD) device.

In some of the embodiments, the chemical vapor deposition device includes, for example, any one or a combination of at least two of a rotary chemical vapor deposition (CVD) reaction furnace, a plasma-enhanced chemical vapor deposition (CVD) reaction furnace, a chemical vapor deposition (CVD) tube furnace, or a fluidized bed.

As an optional technical solution of the present disclosure, the carbon covering layer is an inorganic carbon material layer. It should be noted that the carbon covering layer covers the surfaces of the silicon-containing particles. The surfaces mentioned in the present disclosure not only include the flat surfaces of the particles, but the carbon covering layer may also be filled in cracks, pores, and other structures in the surfaces of the particles, which are not limited here.

In some of the embodiments, the mass fraction of the carbon covering layer in the composite negative electrode material is 1% to 65%, for example, 1%, 10%, 20%, 30%, 40%, 50%, 60%, or 65%, but the mass fraction is not limited to the listed values, and other unlisted values within this numerical range are also applicable. In the present disclosure, if the mass fraction of the carbon covering layer is less than 1%, the covering amount is insufficient, and the performance of the product cannot be fully utilized. If the mass fraction of the carbon covering layer is greater than 65%, the carbon covering amount is excessive, which will adversely affect the capacity and hinder the transmission of lithium ions to degrade the overall performance of the negative electrode material.

In some of the embodiments, in the composite negative electrode material, the carbon covering layer has a thickness of 10 nm to 300 nm, for example, 10 nm, 20 nm, 50 nm, 80 nm, 100 nm, 150 nm, 200 nm, 250 nm, or 300 nm, but the thickness is not limited to the listed values, and other unlisted values within this numerical range are also applicable. If the carbon covering layer is too thick, the lithium ion transmission efficiency is reduced, the material is not advantageous in charging and discharging at a high rate, and the overall performance of the negative electrode material will be degraded. An excessively thin carbon covering layer does not contribute to an increase in the conductivity of the negative electrode material and has a weak capability of inhibiting the expansion of the volume of the material, resulting in poor long-cycling performance.

In some of the embodiments, the preparation method further includes: natural cooling after the chemical vapor deposition reaction.

As a further optional technical solution of the preparation method described in the present disclosure, the method includes the steps of:

heating silicon-containing particles to 700° C. to 1150° C. in the presence of a protective atmosphere;

introducing a carbon-containing gas and hydrogen in a molar ratio of (2-10):1 (2:1 to 10:1) into the silicon-containing particles to carry out a chemical vapor deposition reaction and controlling the reaction to take place at a gas pressure of 1.0 atm to 10.0 atm and at the temperature maintained for 3 h to 16 h, so that a carbon covering layer is formed on at least part of surface of the silicon-containing particles to obtain the composite negative electrode material.

In a third aspect, the present disclosure provides a lithium battery. The lithium battery comprises the composite negative electrode material described in the above first aspect or the composite negative electrode material prepared by the preparation method described in the above second aspect.

The embodiments of the present disclosure will be further described by way of multiple examples below. Here, the embodiments of the present disclosure are not limited to the following specific examples. Appropriate changes can be implemented within the scope as claimed.

Example 1

In this example, the composite negative electrode material was prepared according to the following method:

1.5 kg of SiO powder was taken and added to a 5 L experimental batch-type rotary CVD furnace, and nitrogen was introduced into the furnace for atmosphere replacement. After the oxygen content in the discharged gas was less than 200 ppm, the temperature was raised while continuously introducing nitrogen. After the temperature was raised to 900° C., methane was introduced at a rate of 0.8 L/min using nitrogen as a carrier gas, and the reaction pressure was maintained at 1.2 atm. After a continuously 6-hour reaction, the methane gas was cut off, and the resulting product was naturally cooled down to obtain the composite negative electrode material.

The negative electrode material was output and then broken up and sieved and subjected to Raman spectroscopy testing (an XPLORA laser confocal Raman spectrometer manufactured by HORIBA (Japan) was used, with a laser wavelength of 532 nm and a test range of 100 cm$^{-1}$ to 2800 cm$^{-1}$, this type of Raman spectrometer was used for testing in each of other examples and comparative examples and the test conditions were the same as those in Example 1) and to carbon content testing (the testing was performed using a G4 ICARUS HF infrared sulfur/carbon analyzer manufactured by Bruker (Germany), and the carbon content was tested by using this type of tester in each of other examples and comparative examples).

The negative electrode material prepared in this example includes a SiO core and an inorganic carbon material covering layer covering the surface of the SiO core, wherein the mass fraction of the carbon covering layer is 2.53%. The Raman spectrum of the negative electrode material prepared in this example has a characteristic peak A of silicon at 504 cm$^{-1}$, a characteristic peak B of carbon at 1352 cm$^{-1}$, a characteristic peak C of carbon at 1601 cm$^{-1}$, and a characteristic peak D of graphene structure at 2695 cm$^{-1}$, where the peak intensity $I_A$=90.2, $I_B$=109.0, $I_D$=54.5, $I_A/I_D$ is 1.65, and $I_D/I_B$ is 0.50.

The results of performance testing of the composite negative electrode material prepared in this example are shown in Table 1.

Figure 2:
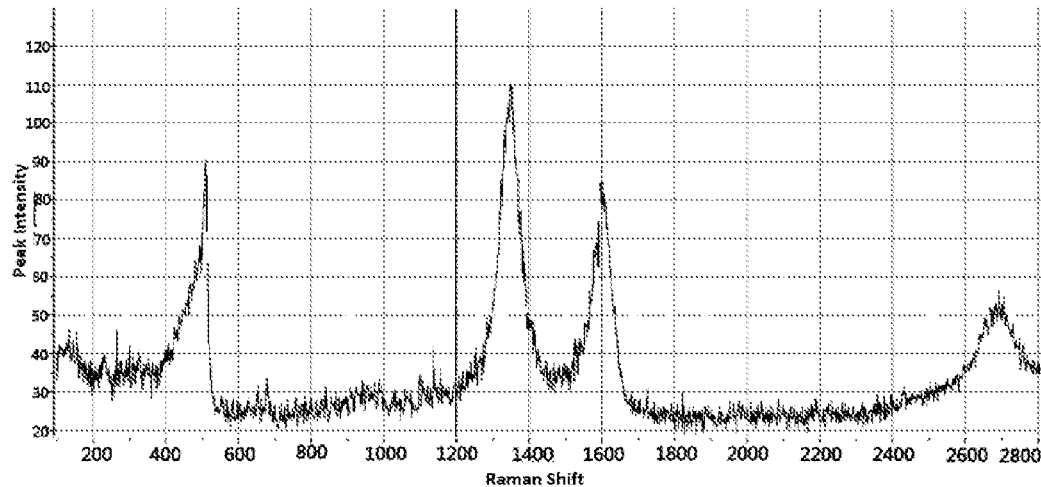
FIG. 2 is a Raman spectrum of a composite negative electrode material prepared in Example 1.

FIG. 2 is the Raman spectrum of the composite negative electrode material prepared in this example. It can be seen from this figure that the product exhibits a characteristic peak of graphene structure.

Figure 3:
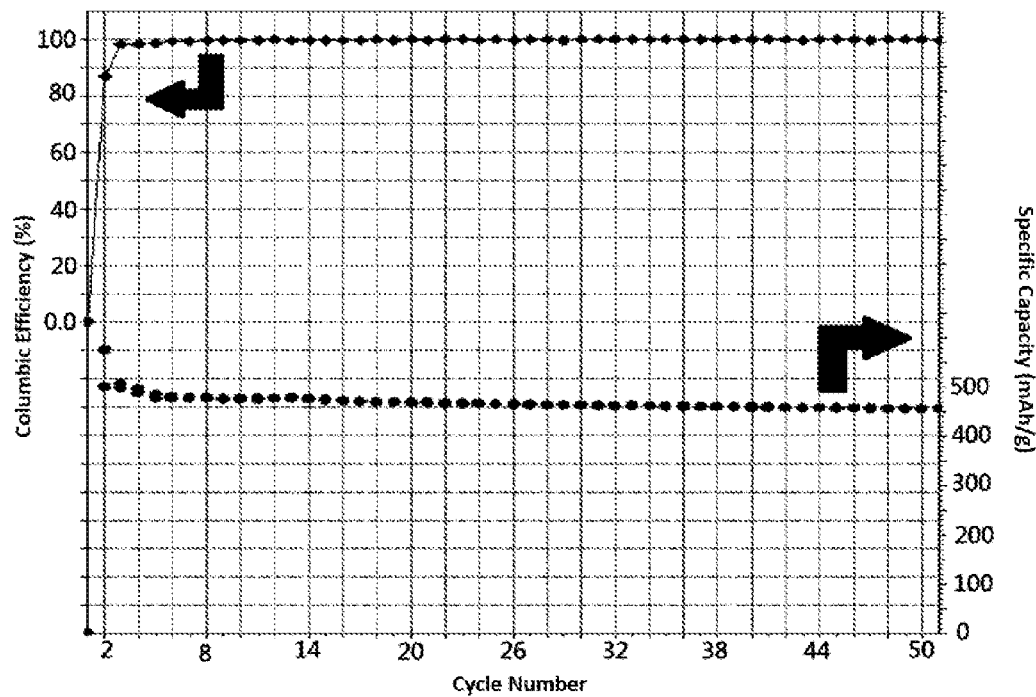
FIG. 3 is a curve showing the cycling performance of the composite negative electrode material prepared in Example 1.

FIG. 3 is a curve showing the cycling performance of the composite negative electrode material prepared in this example. It can be seen from this figure that the product has good cycling performance and good rate capability (at 1 C/0.1 C).

Example 2

In this example, the composite negative electrode material was prepared according to the following method:

150 g of porous silicon powder (with a specific surface area greater than 150 cm$^2$/g) was taken and added to a 5 L experimental batch-type rotary CVD furnace, and nitrogen was introduced into the furnace for atmosphere replacement. After the oxygen content in the discharged gas was less than 200 ppm, the temperature was raised while continuously introducing nitrogen. After the temperature was raised to 935° C., methane was introduced at a rate of 1.0 L/min using nitrogen as a carrier gas, and the reaction pressure was maintained at 2.0 atm. After a continuously 10-hour reaction, the methane gas was cut off, and the resulting product was naturally cooled down to obtain the composite negative electrode material.

The negative electrode material was output and then broken up and sieved, and tested.

The negative electrode material prepared in this example includes a porous silicon core and an inorganic carbon material covering layer covering the surface of the porous silicon core, wherein the mass fraction of the carbon covering layer is 41.2%. The Raman spectrum of the negative electrode material prepared in this example has a characteristic peak A of silicon at 501 cm$^{-1}$, a characteristic peak B of carbon at 1348 cm$^{-1}$, a characteristic peak C of carbon at 1591 cm$^{-1}$, and a characteristic peak D of graphene structure at 2682 cm$^{-1}$, where the peak intensity $I_A/I_D$ is 4.35, and $I_D/I_B$ is 0.34.

The results of performance testing of the composite negative electrode material prepared in this example are shown in Table 1.

Figure 4:
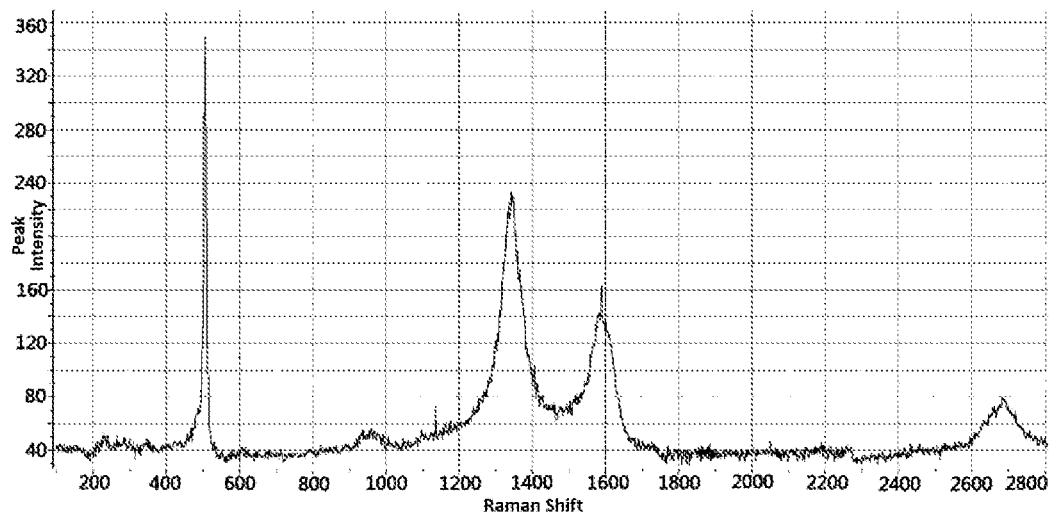
FIG. 4 is a Raman spectrum of a composite negative electrode material prepared in Example 2.

FIG. 4 is the Raman spectrum of the composite negative electrode material prepared in this example. It can be seen from this figure that the product exhibits a characteristic peak of graphene structure.

Figure 5:
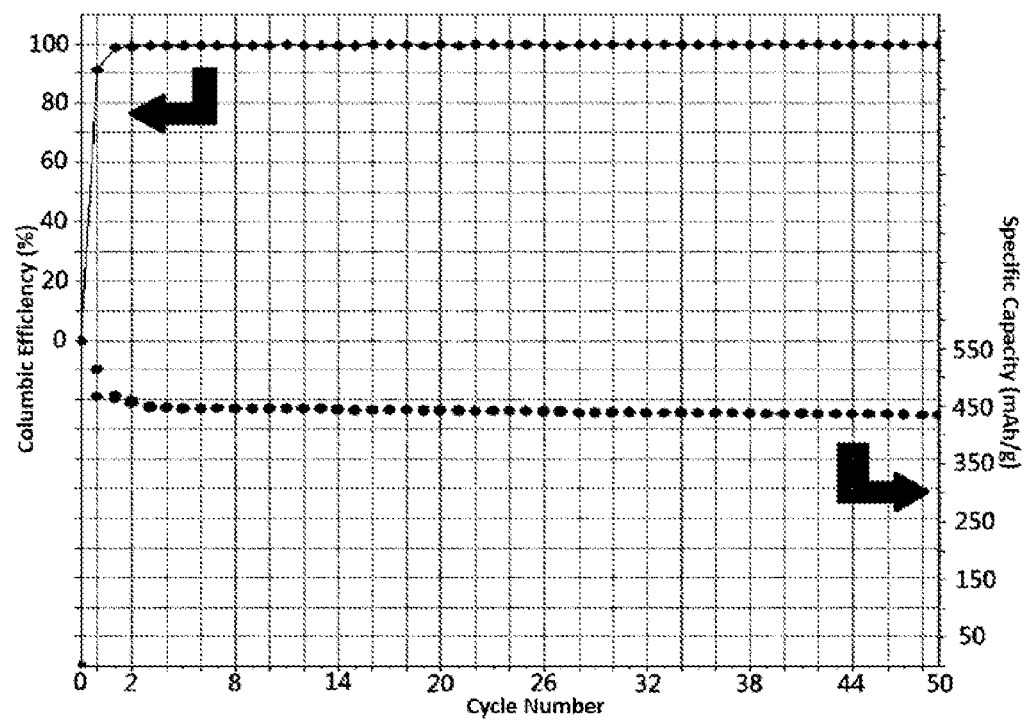
FIG. 5 is a curve showing the cycling performance of the composite negative electrode material prepared in Example 2.

FIG. 5 is a curve showing the cycling performance of the composite negative electrode material prepared in this example. It can be seen from this figure that the product has good cycling performance and good rate capability (at 1 C/0.1 C).

Example 3

1.5 kg of SiO powder was taken and added to a 5 L experimental batch-type rotary CVD furnace, and nitrogen was introduced into the furnace for atmosphere replacement. After the oxygen content in the discharged gas was less than 200 ppm, the temperature was raised while continuously introducing nitrogen. After the temperature was raised to 700° C., a gas mixture of acetylene and hydrogen (in a molar ratio of acetylene to hydrogen of 2:1) was introduced at a rate of 1.8 L/min using nitrogen as a carrier gas, and the reaction pressure was maintained at 1.0 atm. After a continuously 16-hour reaction, the gas mixture was cut off, and the resulting product was naturally cooled down to obtain the composite negative electrode material.

The negative electrode material prepared in this example includes a SiO core and an inorganic carbon material covering layer covering the surface of the SiO core, wherein the mass fraction of the carbon covering layer is 4.3%. The Raman spectrum of the negative electrode material prepared in this example has a characteristic peak A of silicon at 503 $cm^{-1}$, a characteristic peak B of carbon at 1351 $cm^{-1}$, a characteristic peak C of carbon at 1597 $cm^{-1}$, and a characteristic peak D of graphene structure at 2691 $cm^{-1}$, where the peak intensity $I_A/I_D$ is 6.73, and $I_D/I_B$ is 0.34.

The results of performance testing of the composite negative electrode material prepared in this example are shown in Table 1.

Example 4

2 kg of a Si—O—C—Li composite was taken and added to a 5 L experimental batch-type rotary CVD furnace, and argon was introduced into the furnace for atmosphere replacement. After the oxygen content in the discharged gas was less than 200 ppm, the temperature was raised while continuously introducing argon. After the temperature was raised to 1150° C., a gas mixture of acetylene and hydrogen (in a molar ratio of acetylene to hydrogen of 4:1) was introduced at a rate of 0.8 L/min using argon as a carrier gas, and the reaction pressure was maintained at 10.0 atm. After a continuously 3-hour reaction, the gas mixture was cut off, and the resulting product was naturally cooled down to obtain the composite negative electrode material.

The negative electrode material prepared in this example includes a core of silicon monoxide/silicon/lithium metasilicate and an inorganic carbon material covering layer covering the surface of the core of silicon monoxide/silicon/lithium metasilicate, wherein the mass fraction of the carbon covering layer is 2.5%. The Raman spectrum of the negative electrode material prepared in this example has a characteristic peak A of silicon at 501 $cm^{-1}$, a characteristic peak B of carbon at 1347 $cm^{-1}$, a characteristic peak C of carbon at 1598 $cm^{-1}$, and a characteristic peak D of graphene structure at 2692 $cm^{-1}$, where the peak intensity $I_A/I_D$ is 8.59, and $I_D/I_B$ is 0.24.

The results of performance testing of the composite negative electrode material prepared in this example are shown in Table 1.

Example 5

In this example, the operating conditions and types of raw materials were the same as those in Example 3, except that the molar ratio of acetylene to hydrogen was 10:1.

The negative electrode material prepared in this example includes a SiO core and an inorganic carbon material covering layer covering the surface of the SiO core, wherein the mass fraction of the carbon covering layer is 4.1%. The Raman spectrum of the negative electrode material prepared in this example has a characteristic peak A of silicon at 501 $cm^{-1}$, a characteristic peak B of carbon at 1347 $cm^{-1}$, a characteristic peak C of carbon at 1592 $cm^{-1}$, and a characteristic peak D of graphene structure at 2685 $cm^{-1}$, where the peak intensity $I_A/I_D$ is 6.68, and $I_D/I_B$ is 0.30.

The results of performance testing of the composite negative electrode material prepared in this example are shown in Table 1.

Example 6

In this example, the raw materials and operating conditions were the same as those in Example 1, except that the reaction was carried out at a gas pressure of 13 atm.

The negative electrode material prepared in this example includes a SiO core and an inorganic carbon material covering layer covering the surface of the SiO core, wherein the mass fraction of the carbon covering layer is 0.7%. The Raman spectrum of the negative electrode material prepared in this example has a characteristic peak A of silicon at 505 $cm^{-1}$, a characteristic peak B of carbon at 1352 $cm^{-1}$, a characteristic peak C of carbon at 1597 $cm^{-1}$, and a characteristic peak D of graphene structure at 2701 $cm^{-1}$, where the peak intensity $I_A/I_D$ is 19.2, and $I_D/I_B$ is 0.61.

The results of performance testing of the composite negative electrode material prepared in this example are shown in Table 1.

Example 7

In this example, the raw materials and operating conditions were the same as those in Example 1, except that the reaction was carried out at a temperature of 1450° C.

The negative electrode material prepared in this example includes a SiO core and an inorganic carbon material covering layer covering the surface of the SiO core, wherein the mass fraction of the carbon covering layer is 4.3%. The Raman spectrum of the negative electrode material prepared in this example has a characteristic peak A of silicon at 502 $cm^{-1}$, a characteristic peak B of carbon at 1342 $cm^{-1}$, a characteristic peak C of carbon at 1601 $cm^{-1}$, and a characteristic peak D of graphene structure at 2694 $cm^{-1}$, where the peak intensity $I_A/I_D$ is 5.4, and $I_D/I_B$ is 0.24.

The results of performance testing of the composite negative electrode material prepared in this example are shown in Table 1.

Example 8

In this example, the raw materials and operating conditions were the same as those in Example 3, except that no hydrogen but only acetylene was introduced, and the reactant gas was introduced at a rate of 0.1 L/min and the reaction was continued for 24 hours.

The negative electrode material prepared in this example includes a SiO core and an inorganic carbon material covering layer covering the surface of the SiO core, wherein the mass fraction of the carbon covering layer is 6.4%. The Raman spectrum of the negative electrode material prepared in this example has a characteristic peak A of silicon at 503 $cm^{-1}$, a characteristic peak B of carbon at 1341 $cm^{-1}$, a characteristic peak C of carbon at 1602 $cm^{-1}$, and a characteristic peak D of graphene structure at 2696 $cm^{-1}$, where the peak intensity $I_A/I_D$ is 4.5, and $I_D/I_B$ is 0.16.

The results of performance testing of the composite negative electrode material prepared in this example are shown in Table 1.

Comparative Example 1

In this comparative example, the negative electrode material was prepared according to the following method:

1.5 kg of SiO powder was taken and added to an experimental batch-type rotary CVD furnace, and nitrogen was introduced into the furnace for atmosphere replacement. After the oxygen content in the discharged gas was less than 200 ppm, the temperature was raised while continuously introducing nitrogen. After the temperature was raised to 680° C., acetylene was introduced at a rate of 1.5 L/min using nitrogen as a carrier gas, and the reaction pressure was maintained at 1.4 atm. After a continuously 5-hour reaction, the acetylene gas was cut off, and the resulting product was naturally cooled down to obtain a negative electrode material.

The negative electrode material was output and then broken up and sieved, and tested.

The mass fraction of the carbon covering layer of the negative electrode material was 4.21% (i.e., the carbon content). No characteristic peak D of graphene structure was observed as a result of the Raman test.

The results of performance testing of the negative electrode material prepared in this comparative example are shown in Table 1.

Figure 6:
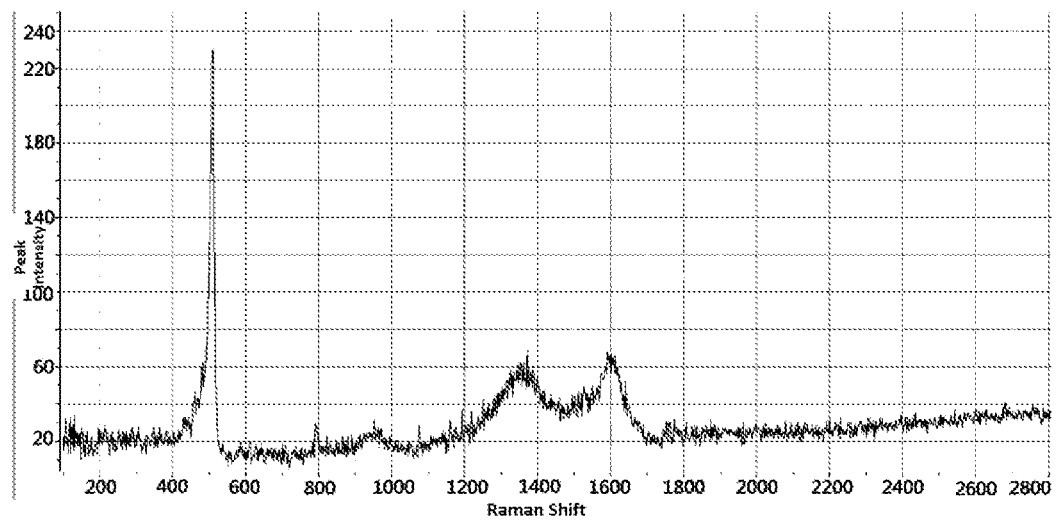
FIG. 6 is a Raman spectrum of a composite negative electrode material prepared in Comparative Example 1.

FIG. 6 is the Raman spectrum of the composite negative electrode material prepared in this comparative example. It can be seen from this figure that the product has no graphene structure.

Figure 7:
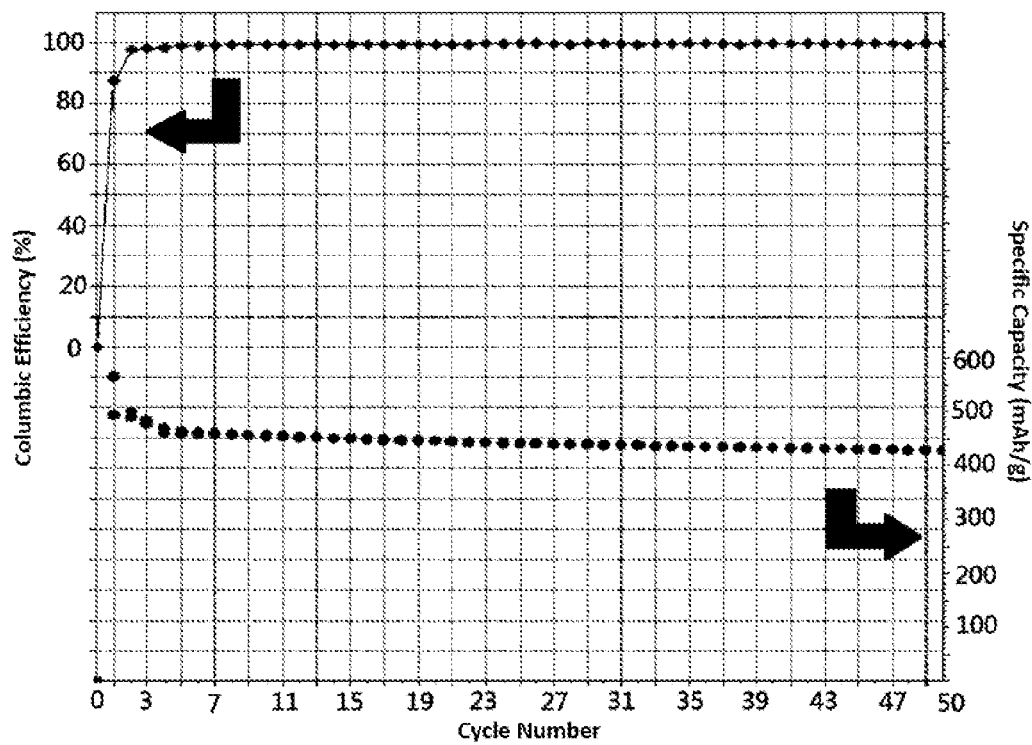
FIG. 7 is a curve showing the cycling performance of the composite negative electrode material prepared in Comparative Example 1.

FIG. 7 is a curve showing the cycling performance of the composite negative electrode material prepared in this comparative example. It can be seen from this figure that the product exhibits deteriorated cycling performance and rate capability.

Comparative Example 2

In this comparative example, the raw materials and operating conditions were the same as those in Example 1, except that the reaction was carried out at a temperature of 500° C.

The negative electrode material obtained in this comparative example was subjected to Raman testing. As a result, no characteristic peak D of graphene structure was observed.

The results of performance testing of the negative electrode material prepared in this comparative example are shown in Table 1.

Performance Testing Method

The negative electrode material prepared in each of the Examples and Comparative Examples was mixed with a commercial graphite negative electrode in a ratio of 10:90 to be used as an active material of negative electrode. The graphite was selected from the artificial graphite S360 series produced by BTR New Material Group Co., Ltd. (Shenzhen, China). The electrode sheet coating had the active material, a conductive agent (Super P), and a binder (CMC+SBR) in a mass ratio of 92:4:4, and the counter electrode was a lithium sheet. A button battery was assembled using 1 mol/L $LiPF_6$/EC+DMC+EMC (v/v=1:1:1) as an electrolyte and Celgard 2400 as a separator. This battery was used for cycling test.

The negative electrode material prepared in each of the Examples and Comparative Examples was used as an active material of negative electrode. The electrode sheet coating had the active material, a conductive agent (Super P), and a binder (CMC+SBR) in a mass ratio of 92:4:4, and the counter electrode was a lithium sheet. A button battery was assembled using 1 mol/L $LiPF_6$/EC+DMC+EMC (v/v=1:1:1) as an electrolyte and Celgard 2400 as a separator. This battery was used for charge and discharge test at the first cycle.

The negative electrode material prepared in each of the Examples and Comparative Examples was mixed with a commercial graphite negative electrode in a ratio of 10:90 to be used as an active material of negative electrode. The graphite was selected from the artificial graphite S360 series produced by BTR New Material Group Co., Ltd. (Shenzhen, China). The negative electrode sheet coating had the active material of negative electrode, a conductive agent (Super P), and a binder (CMC+SBR) in a mass ratio of 95.8:1.0:3.2. The positive electrode sheet coating had an active material of positive electrode (an NCA ternary material, produced by BTR New Material Group Co., Ltd. (Shenzhen, China), with a product name of N8-S), a conductive agent (Super P), and a binder (PVDF) in a mass ratio of 97.3:1.0:1.7. A 18650-type battery was assembled using Celgard 2400 as a separator and using 1 mol/L $LiPF_6$/EC+DMC+EMC (v/v=1:1:1) as an electrolyte and was used for testing of aging loss at high temperature.

The electrochemical tests of the above-mentioned batteries were performed by using a LAND battery test system.

At room temperature, each of the button batteries was cycled at 0.1 C, 0.2 C, and 0.5 C for one cycle, and then charged and discharged at 10 for 47 cycles. The cycle capacity retention ratio of each product at 50 cycles was obtained by dividing the capacity at the 50th cycle by the capacity at the first cycle. The rate capability of the product was evaluated by dividing the capacity at 0.1 C by the capacity at 10.

Each of the 18650 batteries which had undergone formation was charged and discharged at a voltage ranging from 2.5 to 4.2 V at 0.3 C to record its reversible capacity, then charged to 4.2 V at 0.3 C and left to rest at a temperature of 60° C. for 3 days in a fully charged state, and then discharged to 2.5V at 0.3 C after 3 days. A difference between the dischargeable capacity after stored and the recorded reversible capacity was calculated. The aging loss of the product was obtained by dividing the calculated difference by the recorded reversible capacity.

The results of the above performance tests are shown in Table 1.

TABLE 1

|  | Reversible Specific Capacity at First Cycle (mAh/g) | Capacity Retention Ratio at 0.1 C/1 C (%) | Cycle Retention ratio (%) | Aging Loss (%) |
| --- | --- | --- | --- | --- |
| Example 1 | 1656 | 94.3 | 91.2 | 1.6 |
| Example 2 | 2201 | 95.7 | 93.0 | 2.2 |
| Example 3 | 1677 | 95.0 | 91.7 | 2.3 |
| Example 4 | 1324 | 93.7 | 89.5 | 0.4 |
| Example 5 | 1651 | 94.4 | 90.8 | 2.4 |
| Example 6 | 1658 | 91.1 | 87.7 | 3.2 |
| Example 7 | 1402 | 92.2 | 88.2 | 2.1 |
| Example 8 | 1527 | 93.3 | 89.1 | 2.6 |
| Comparative Example 1 | 1534 | 91.4 | 86.6 | 4.7 |
| Comparative Example 2 | 1670 | 90.7 | 82.1 | 5.6 |

As can be seen from the above Examples and Comparative Examples, each of the composite negative electrode materials prepared in Examples 1 to 5 of the present disclosure has unique Raman spectral peaks, including a characteristic peak D as a characteristic peak of graphene structure, and exhibits satisfactory $I_A/I_D$ and $I_D/I_B$. Accordingly, the composite negative electrode materials according to the above Examples have advantages such as a high cycle capacity retention ratio, good rate capability, and low aging loss at high temperature.

The reaction pressure in Example 6 is too high, resulting in a too low reaction rate and low carbon content, whereas Example 1 is carried out at a reaction pressure of 1.2 atm. The battery made of the composite negative electrode material according to Example 1 is superior to that made according to Example 6 in terms of various properties such as the capacity retention ratio, cycle retention ratio, and aging loss. It can thus be seen that it is more appropriate to control the reaction pressure in a range of 1.0 atm to 10.0 atm, which can not only guarantee the performance of the product, but also reduce safety risks in production.

The reaction temperature in Example 7 is too high and reaches the boundary value, resulting in the generation of a small amount of electrochemically inert silicon carbide by the reaction of a small amount of the carbon covering layer with the silicon-containing particles. In contrast, Example 1 is carried out at a reaction temperature of 900° C., at which the reaction has occurred more moderately. The battery made of the composite negative electrode material according to Example 1 is superior to that made according to Example 7 in terms of various properties such as the reversible specific capacity at the first cycle, capacity retention ratio, cycle retention ratio, and aging loss. It can thus be seen that it is more appropriate to control the reaction temperature in a range of 700° C. to 1150° C., which can guarantee the electrochemical capacity and rate capability of the product.

No hydrogen is used as an auxiliary gas in Example 8. Compared with Example 3, acetylene should be used in Example 8 at a lower flow rate to produce a graphene structure, which leads to a longer reaction time required in Example 8 and a decrease in production efficiency. It can thus be seen that the addition of an auxiliary gas allows for a controlled reaction rate of the acetylene gas and an increased efficiency of generation of the graphene structure.

In Comparative Example 1, methane in Example 1 is replaced with acetylene and the reaction temperature is too low, resulting in no generation of a graphene structure.

The reaction temperature in Comparative Example 2 is too low, resulting in no generation of a graphene structure.

Since the negative electrode materials in Comparative Examples 1 and 2 have no graphene structures, the solid-liquid interfaces between the composite negative electrode materials and the electrolytes can hardly be kept stable. Although the batteries made according to Comparative Examples 1 and 2 have comparable reversible specific capacities at the first cycle to those of Examples 1 to 8, the batteries exhibit decreases in both capacity retention ratio and cycle retention ratio after long-term cycling, and the aging losses of the batteries are worsened. In contrast, the carbon covering layer containing the graphene structure can improve the stability of the solid-liquid interface between the particle surface of the composite negative electrode material and the electrolyte to form a uniform SEI film, so that a battery made of the composite negative electrode material containing the graphene structure exhibits various improved properties including reversible specific capacity at the first cycle, capacity retention ratio, cycle retention ratio, and aging loss. The applicant declares that the detailed methods of the present disclosure are described by the foregoing embodiments in the present disclosure, but the present disclosure is not limited to the foregoing detailed methods. In other words, it is not intended that the implementation of the present disclosure must rely on the foregoing detailed methods. It should be understood by those skilled in the art that any modifications of the present disclosure, equivalent replacement of each of raw materials of the products of the present disclosure, addition of auxiliary ingredients, and selection of specific methods or the like should fall within the scope as claimed and disclosed in the present disclosure.

What is claimed is:

1. A composite negative electrode material, comprising silicon-containing particles and a carbon covering layer, wherein the carbon covering layer covers at least part of surface of the silicon-containing particles,
   wherein in a Raman spectrum, the composite negative electrode material has a characteristic peak A of silicon between 450 cm$^{-1}$ and 550 cm$^{-1}$, a characteristic peak B of carbon between 1300 cm$^{-1}$ and 1400 cm$^{-1}$, a characteristic peak C of carbon between 1530 cm$^{-1}$ and 1630 cm$^{-1}$, and a characteristic peak D of graphene structure between 2500 cm$^{-1}$ and 2750 cm$^{-1}$, a ratio $I_A/I_D$ of a peak intensity $I_A$ of the characteristic peak A of silicon to a peak intensity $I_D$ of the characteristic peak D of graphene structure is greater than 1 and less than 30, and a ratio $I_D/I_B$ of the peak intensity $I_D$ of the characteristic peak D of graphene structure to a peak intensity $I_B$ of the characteristic peak B of carbon is greater than 0 and less than 1.

2. The composite negative electrode material according to claim 1, wherein the composite negative electrode material satisfies at least one of following definitions a to f:
   a. the silicon-containing particles comprise at least one of Si, SiO$_x$, and silicate, wherein 0<x<2;
   b. the silicon-containing particles have an average particle size of 0.1 μm to 20 μm;
   c. the silicon-containing particles have a specific surface area greater than 150 cm$^2$/g;
   d. the carbon covering layer is an inorganic carbon material layer;
   e. the carbon covering layer has a thickness of 10 nm to 300 nm; and f. the composite negative electrode material comprises, by mass fraction, 1% to 65% of the carbon covering layer.

\* \* \* \* \*